United States Patent [19]
Fromont

[11] Patent Number: 5,831,825
[45] Date of Patent: *Nov. 3, 1998

| [54] | INTEGRATED CIRCUIT IC PACKAGE AND A PROCESS FOR COOLING AN INTEGRATED CIRCUIT MOUNTED IN AN IC PACKAGE |
|---|---|
| [75] | Inventor: Thierry Fromont, Massy, France |
| [73] | Assignee: Bull, S.A., Louveciennes, France |
| [*] | Notice: This patent issued on a continued prosecution application filed under 37 CFR 1.53(d), and is subject to the twenty year patent term provisions of 35 U.S.C. 154(a)(2). |
| [21] | Appl. No.: 661,876 |
| [22] | Filed: Jun. 12, 1996 |
| [30] | Foreign Application Priority Data |

Jun. 13, 1995 [FR] France ................................... 95 06994

| [51] | Int. Cl.$^6$ ........................................................ H05K 7/20 |
|---|---|
| [52] | U.S. Cl. ........................ 361/719; 257/713; 361/704; 438/15 |
| [58] | Field of Search .................................. 174/252, 16.3; 165/80.3, 185; 257/712, 713, 706, 723, 724, 778, 796; 361/704, 705, 707, 795, 709–713, 717–719, 720, 722, 761, 764, 784, 785, 790, 792; 437/177, 182, 187, 209, 228, 902; 29/593, 831, 832; 438/4, 15, 118, 119 |

[56] References Cited

U.S. PATENT DOCUMENTS

| 4,731,701 | 3/1988 | Kuo ........................................... 361/388 |
|---|---|---|
| 4,982,311 | 1/1991 | Dehaine ................................... 361/388 |
| 5,050,040 | 9/1991 | Gondusky ................................ 361/388 |
| 5,319,237 | 6/1994 | Legros ...................................... 257/522 |
| 5,347,091 | 9/1994 | Schoeder ................................. 174/262 |
| 5,471,366 | 11/1995 | Ozawa ..................................... 361/704 |
| 5,475,264 | 12/1995 | Sudo ........................................ 257/723 |
| 5,506,755 | 4/1996 | Miyagi ..................................... 361/720 |
| 5,583,377 | 12/1996 | Higgins, III ............................. 257/707 |
| 5,600,541 | 2/1997 | Boue ........................................ 361/707 |
| 5,608,261 | 3/1997 | Bhattacharyya ........................ 257/700 |

FOREIGN PATENT DOCUMENTS

| 9308842 | 9/1993 | Germany . |
|---|---|---|
| 4728869 | 11/1972 | Japan . |
| 382060 | 4/1991 | Japan . |
| 778917 | 3/1995 | Japan . |

OTHER PUBLICATIONS

IBM Technical Disclosure Bulletin, vol. 13, No. 1, Jun. 1970, NY, p. 58, G.O. Tiffany, "Integrated Circuit Package and Heat Sink".

1993 Japan IEMT Symposium, Jun. 1994, Kanazawa, JP, pp. 41–45, B. Freyman et al., "Ball Grid Array (bga): the New Standard for High I/o Surface Mount Packages".

4th IEEE/CHMT European Int. Electr. Manuf. Technol. Symp., Jun. 1988, Neuilly Sur Seine, FR, pp. 34–36; C.M. Val et al., "Mounting Open–Via Chip–Carriers (for 100 to 300 inputs/outputs i.c.)".

*Primary Examiner*—Gerald P. Tolin
*Attorney, Agent, or Firm*—Kerkam, Stowell, Kondracki & Clarke, P.C.; Edward J. Kondracki

[57] ABSTRACT

The heat dissipated by the integrated circuit (11) is evacuated into a plate (13) having an extended surface in order to transmit the heat into the integrated circuit package (10) and into the wiring board (12) by means of the input-output terminals (17) of the package.

17 Claims, 2 Drawing Sheets

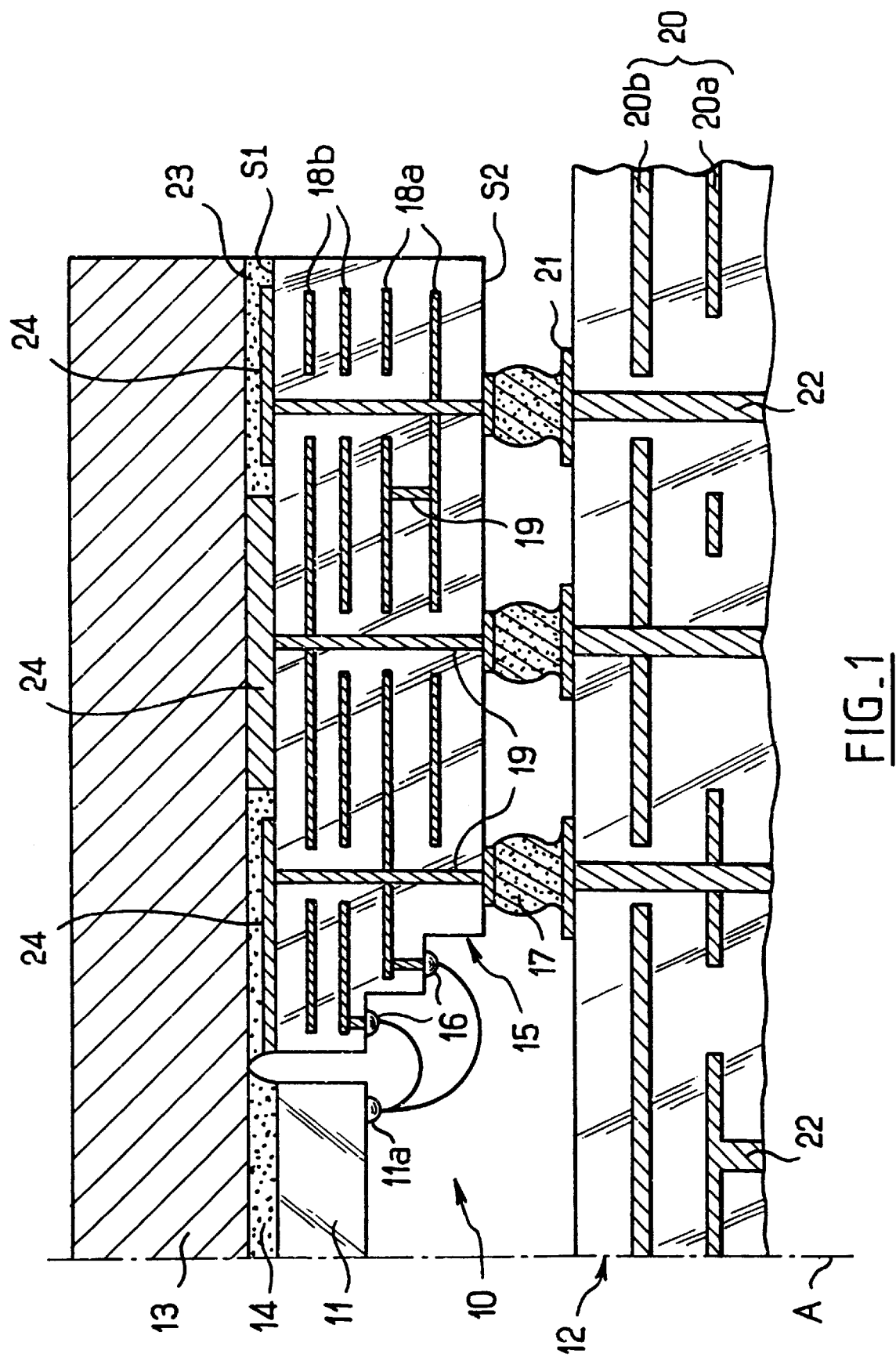
FIG_1

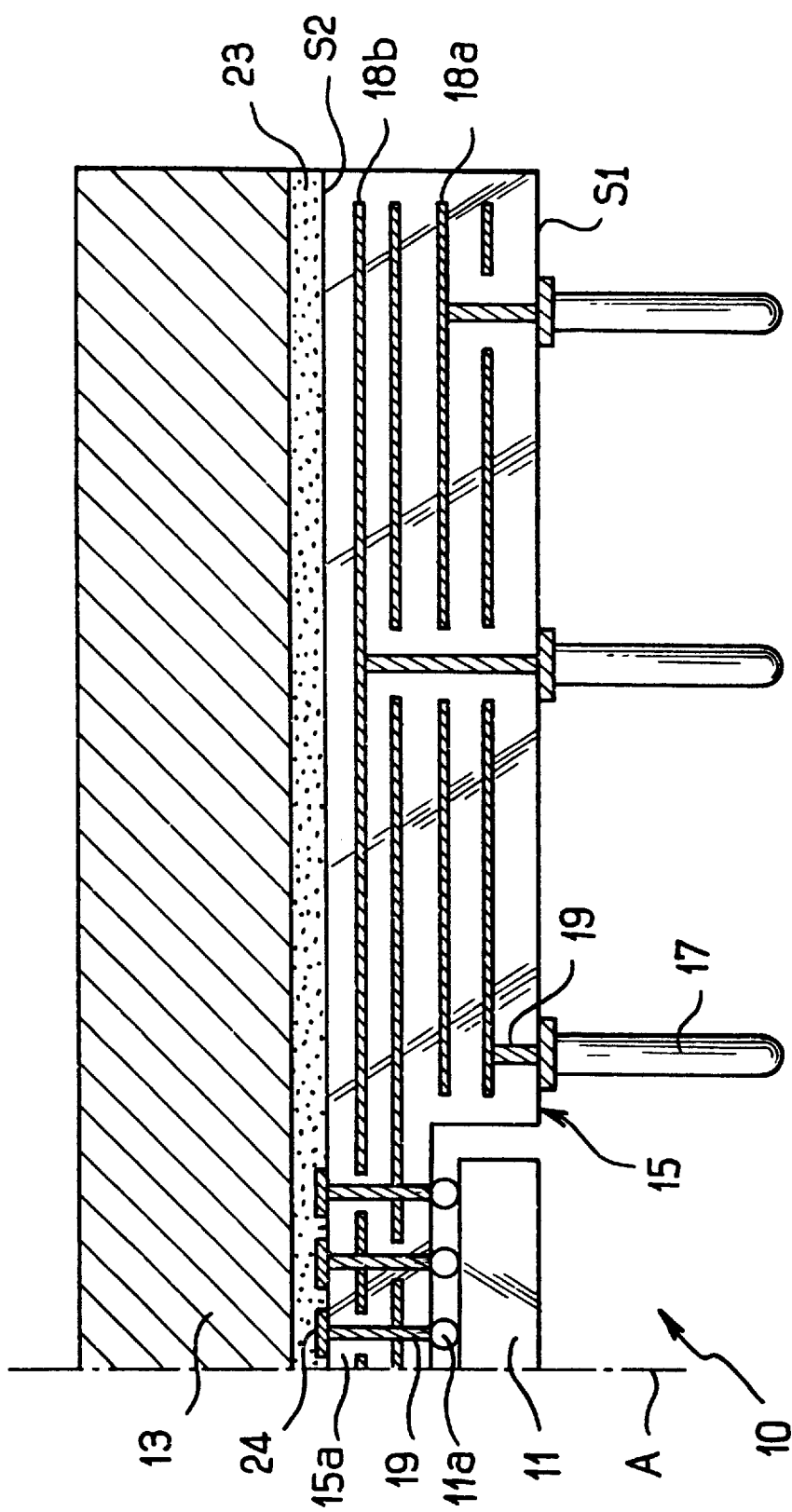
FIG_2

5,831,825

INTEGRATED CIRCUIT IC PACKAGE AND A PROCESS FOR COOLING AN INTEGRATED CIRCUIT MOUNTED IN AN IC PACKAGE

FIELD OF THE INVENTION

The invention relates to processes for cooling an integrated circuit mounted in a package intended for equipping a wiring board. The subjects of the invention are a process of this type, an integrated circuit package and a wiring board equipped with such a package for implementing the invention.

DESCRIPTION OF RELATED ART

The cooling of an integrated circuit package presently poses a substantial problem. At present, an integrated circuit package can reach a considerable size, on the order of 15 to 20 mm per side, and can incorporate several million transistors. It must be capable therefore of continuously dissipating several tens of watts, which it must evacuate efficiently and economically into the package used to connect the integrated circuit to a wiring board such as a printed circuit board.

There are several well known types of integrated circuit packages. They have in common the fact that they form a connecting support for the integrated circuit. The connecting support is made from an electrically insulating material and it includes conductors for linking internal terminals with external terminals. The internal terminals are disposed so as to be connected to respective input-output terminals of the integrated circuit, while the external terminals are used for the external linking of the package to a wiring board. The conductors are generally placed on several superposed layers. The conductors placed on various levels are electrically connected to one another by means of metallized holes provided in the connecting support. The same type of connection can exist between conductors and internal and external terminals of the support. The external terminals can be disposed laterally, or on the periphery of the support, or even on one side of the support. In the latter case, a meshed network of pins known by the name PGA (Pin Grid Array) or preferably at present, a surface mount by means of balls disposed in a meshed network, currently designated a BGA (Ball Grid Array) mount or SMT (Surface Mount Technology), are usually used as the terminals. The balls are placed on conductive areas of the surface, ordinarily formed by extensions of the metallized holes in the form of conductive rings which connect them to the respective conductors of the support.

Several types of processes and devices for cooling an integrated circuit mounted in a package are known. They are principally distinguished from one another by the type of fluid used. The most common process uses air, often ventilated, as the cooling fluid and uses a heat sink as the cooling device. In a first type of package, the non-active side of the integrated circuit is placed in direct contact with the cooling device by means of a layer of adhesive or solder. In a second type, the cooling device is bonded to the integrated circuit by means of a part which constitutes a thermal interface of the package. The interface can be made from an extension of the insulating support when the electrically insulating material is a relatively good heat conductor, such as a ceramic. It can also be made from a plate of material which is a good heat conductor, commonly copper or aluminum. It is placed so as to come into contact with one side of the integrated circuit through an adhesive layer with low thermal resistance. The connecting support ordinarily surrounds the plate, forming with it a co-planar surface. In this case, it is usually made from a material which is electrically and thermally insulating, such as a ceramic, a plastic, or an epoxy glass.

Any cooling device is costly, even before being properly adapted to the package, to the thermal energy dissipated by the integrated circuit, to the connection mode of the package and to the environment of the package, as well as to the fluid used for cooling. The least expensive cooling device is the ribbed heat sink. But it must be mounted on the package in such a way that the interface between the heat sink and the integrated circuit has low thermal resistance. It is also necessary to attach the heat sink to the package. The heat sink is often attached to the wiring board of the package and it must sometimes be removable. The attachment must satisfy various constraints, such as defects in flatness or fabrication, or different thermal expansions between the heat sink and its attaching support, etc. It must also absorb mechanical shocks and vibrations. In short, although it is reputed to be the least costly of the cooling devices, its cost includes the necessary studies for properly adapting it to its context, its fabrication, its handling and its attachment. Moreover, when the heat sink is attached to the wiring board of the package, the attachment is achieved to the detriment of the density of the interconnecting circuits of the board and of the connection density of the packages on the board. In addition, when a plate is used as the interface between the integrated circuit and the heat sink, experimental studies show that the enlargement of the thermal evacuation plate beyond the surface of the integrated circuit has little effect on the thermal evacuation. In fact, the flow of heat from the integrated circuit to the heat sink runs through the plate in a cone which flares slightly toward the sole of the heat sink. The sole of the heat sink is often thick in order to diffuse the heat as uniformly as possible to the ribs of the heat sink, and it occupies the maximum surface area possible in order to optimize the heat exchange surface between the ribs and the air. Under these conditions, the interface plate has a slight thickness in order to minimize the volume of the space occupied by the package and its cost, and since it is also useless to enlarge it much in order to facilitate thermal evacuation, it has a surface area substantially equal to that of the integrated circuit. In practice, the plate has a slightly larger surface area so that its edges may be used for its attachment to the connecting support of the package.

SUMMARY OF THE INVENTION

The essential object of the invention is to appreciably facilitate the cooling of an integrated circuit mounted in a package and to considerably reduce its cost. As a result of the invention, the thermal evacuation in the package can be efficient enough to eliminate the use of a cooling device such as a heat sink.

The subject of the invention is a process for cooling an integrated circuit mounted in a package provided with external terminals for connection to a wiring board, which consists of using a plate for evacuating the heat dissipated by the integrated circuit and which is characterized in that it consists of extending the surface of the plate so as to transmit the heat into the package and into the wiring board by means of the external terminals of the package.

The result is an integrated circuit package comprising external terminals for connecting the package to a wiring board, provided with a plate for evacuating the heat dissipated by the integrated circuit, characterized in that the surface of the plate extends in such a way as to transmit the heat into the package and in that the package includes means to facilitate the evacuation of the heat in the package toward the external terminals of the package.

Therefore, a corollary subject of the invention is a wiring board equipped with at least one integrated circuit package, characterized in that the package implements the process and/or is that defined previously.

BRIEF DESCRIPTION OF THE DRAWINGS

The characteristics and advantages of the invention will emerge from the description which follows, given by way of example and in reference to the appended drawings.

In the drawings:

FIG. 1 is a schematic view in partial axial section, limited to the central axis of an integrated circuit package according to the invention mounted on a wiring board of the package; and FIG. 2 is a view similar to that in FIG. 1 which illustrates a variant of embodiment of a package according to the invention.

DESCRIPTION OF THE PREFERRED EMBODIMENTS

FIG. 1 illustrates a package 10 which contains an integrated circuit 11 and is mounted on a wiring board 12. The integrated circuit as well as the structure of the package and the board have dimensions which have been voluntarily modified relative to the actual dimensions in order to be accentuated. The integrated circuit 11 has an active surface provided with input-output terminals 11a, which are peripheral in the example illustrated. The package 10 is provided with a plate 13 whose internal side is thermally bonded to the non-active side of the integrated circuit 11. The bonding may be direct, but in the example illustrated it is achieved by means of a thermal bonding layer 14, for example a layer of adhesive or solder. The package 10 comprises a connecting support 15 made of an electrically insulating material. In the example illustrated, the support 15 is a frame which surrounds the integrated circuit coaxial to its axis A and which has a surface S1 that is substantially co-planar to the non-active side of the integrated circuit. The support 15 includes internal terminals 16, external terminals 17 and conductors 18 (18a and 18b in FIG. 1) and metallized holes 19 linking the internal terminals 16 to the external terminals 17. The internal terminals 16 are placed in proximity to the integrated circuit in order to be connected to its respective terminals 11a. Among the various known types of connections, the connection illustrated is achieved by means of jumpers 16a in accordance with the technology commonly called "wire bonding." The conductors 18 are in the form of conductive wires 18a, and optionally at least one conductive plane 18b. A conductive plane is used to transport the feed energy from the integrated circuit while minimizing the inductive effects. The connecting support 15 illustrated comprises two conductive planes 18b, which respectively represent two feed potentials and are preferably superposed near the integrated circuit. The wires 18a form at least one conductive layer, with two superposed layers being illustrated, and they transport the signals and the feed energy. The support 15 also contains metallized holes 19 for interconnecting the conductors 18 of various levels and/or the external terminals 17 to at least one of the respective conductors 18. The external terminals 17 illustrated are placed on a surface S2 parallel to and opposite the surface S1 and the plate 13, and are connecting balls in accordance with the above-mentioned BGA technology, disposed in a meshed network and connected to the wiring board 12. In the standard way, each ball rests on a conductive external ring 17a around the corresponding metallized hole 19 which links the ball to conductors 18 of the support.

The board 12 is made in the standard way from an insulating material which incorporates a multilayer interconnection circuit 20. The circuit 20 illustrated comprises superposed layers of conductive wires 20a and conductive potential planes 20b (two respective layers are illustrated in the partial section in FIG. 1), with connecting pads 21 and metallized holes 22 linking the connecting pads 21 to conductors 20a, 20b of the board and often also linking conductors of different levels to one another. The external terminals 17 of the package 10 are attached to the respective pads 21 of the board.

In practice, for example, the integrated circuit 11 has a thickness on the order of 0.5 mm, a size on the order of 15 to 20 mm per side, and a number of input-output terminals 11a on the order of 400 to 600, and it can dissipate several tens of watts. The support 15 is in the form of a square frame on the order of 40 mm per exterior side, and has a thickness on the order of 2 mm between the surfaces S1 and S2 for ten conductive layers. The conductive layers 18 commonly have a thickness of 35 to 70 $\mu$m and are separated from one another by insulating layers, ordinarily from 100 to 200 $\mu$m thick. The internal terminals 16 are often distributed over several steps, the highest of which as shown in the drawing is at the level of the active surface of the integrated circuit. The metallized holes 19 have a diameter of about 200 $\mu$m. The balls 17 can number 300 to 600 and they usually have a diameter on the order of 600 to 700 $\mu$m. If the wiring board 12 is the printed circuit type, it can have a thickness of about 3.5 mm and can contain a multilayer circuit 20 of thirty conductive layers having a thickness of 30 to 70 $\mu$m, separated from one another by insulating layers of 100 or 200 $\mu$m. The metallized holes 22 have a diameter which can vary from 0.3 to 5 mm and they contain a layer of copper about 25 $\mu$m thick.

For a standard package of known construction (not shown), it has been seen that the plate 13 is thin, that it is a good heat conductor, that its edges project slightly beyond the surface of the integrated circuit so as to be fixed inside the support or frame 15, and that a radiator is disposed opposite the plate in order to constitute a heat sink to which the heat dissipated by the integrated circuit is directly routed through the plate in a slightly flared cone.

The cooling process according to the invention avoids the necessity of a radiator heat sink and flared cone and consists of extending the surface of the plate 13 in such a way as to transmit the heat into the package and into the board through the external terminals 17 of the package. In the example illustrated, the plate 13 occupies the entire surface area of the upper surface S1 of the package 10. Since the package 10 has no heat sink, the heat supplied by the integrated circuit 11 is forced to spread across the entire surface of the plate. Preferably, it will be assured that the heat is diffused substantially uniformly across the entire surface of the plate, simply by increasing its thickness in order to reduce its thermal resistance. The plate 13 used in the package 10 was made of copper and had a thickness substantially equal to that of the support, namely 2 mm.

The heat conducted by the plate 13 is thus transmitted to the support 15 through a fine adhesive layer 23. If the support 15 is made from a material which is electrically insulating but a relatively good heat conductor such as a ceramic or aluminum, the conductive network 18 can then receive the heat from the plate and conduct it to the balls 17. Otherwise, or in order to substantially improve the transfer of heat by the support 15 in the preceding case, it is possible to use the embodiment illustrated in FIG. 1. The metallized holes 19 which lead to the balls 17 are extended up to the surface S1 of the support, forming islets 24 on the surface. Although normally separated from one another, islets can be joined to one another if they represent the same signal or the same feed potential. These metallic islets collect the heat from the plate, and the metallized holes 19 transmit it directly to the balls 17 and indirectly into the conductive layers 18. The electrically insulating layer 23 illustrated also isolates islets 24 from the plate 13. In practice, the adhesive layer 14 can be an epoxy adhesive with a thickness of 100 to 200 µm. The heat thus transmitted to the balls 17 is evacuated into the board 12, which here serves as a heat sink and a radiator. This is apparent from its above-mentioned characteristics and its function.

It is clear that the islets 24 can be electrically insulating and heat conductive. In this case, they can come directly into contact with the plate 13. They can even be eliminated if the support 15 is made of an insulating material which is a relatively good heat conductor, or if at least the insulating layer which forms the surface S1 of the support 15 is made of insulating material which is a relatively good heat conductor. In the latter case, metallized holes 19 could also not be extended or metallized up to the surface S1. It would then also be possible for the conductive layer formed by the islets to form a potential plane only, for example replacing or in addition to the plane 18a. This external layer could then be placed in electrical and thermal contact with the plate 13. Although the adhesive layer 23 can completely cover the support, it is understood that it can also be eliminated entirely, or only partially when, as in the example illustrated, there are conductive islets which are higher than the other islets as shown in the drawing by central islet 24 which is placed in contact with the plate 13. The higher conductive islet 24 in the example illustrated is connected to a conductive plane 18b representing a feed potential which may be necessary for the integrated circuit if it is a field effect transistor circuit. According to another variant, the plate 13 could serve as a substrate for the fabrication of the support. Moreover, metallized holes 19 inside the support which are not connected to the balls could be extended in the same way, in order to further improve the transmission of the heat by the support.

There are still other possible variants for the implementation of the process according to the invention. FIG. 2 illustrates a first variant of embodiment of a package according to the invention, viewed in a similar way as that in FIG. 1. In this FIG. 1, the elements which have the same functions are designated by the same reference numbers. In the package 10 in FIG. 2, the support 15 is a frame which encloses the central opening by means of a thermal interface part 15a which forms in the frame 15 a cavity for housing the integrated circuit 11. The thermal interface 15a can contain conductive layers 18, as illustrated. The active side of the integrated circuit is connected to the thermal interface part 15a in accordance with the technology called "flip chip", by means of small balls which constitute the input-output terminals 11a. The heat dissipated by the integrated circuit is evacuated through these balls 11a and the thermal interface 15a. Metallized holes 19, as well as islets 24, can be added to it as illustrated. However, according to this variant, the support 15 is made from an electrically insulating and heat conductive material. The frame of the support which surrounds the integrated circuit is made in the standard way, without the extension of the metallized holes to the surface S1. On the other hand, the external terminals 17 are pins. Generally, it is understood that the external terminals are preferably massive, particularly if they are not very numerous. In addition, FIG. 2 makes it apparent that the layer 23 could be omitted if the support 15 were made directly from the plate 13.

According to another possible variant, the link between the integrated circuit 11 and the board 12 could also be achieved according to the technology known by the name of tape connection, and well known by the name of TAB (Tape-Automated Bonding) technology. Taking into account the examples described above, one skilled in the art could apply this technology to the package 10 without any problem.

In general, it may therefore be said that the subject of the invention is a package 10 for an integrated circuit 11, comprising external terminals 17 for connecting the package to a board 12 and provided with a plate 13 for evacuating the heat dissipated by the integrated circuit, which surface of the plate is extended so as to transmit the heat into the package and which package includes means for facilitating the evacuation of the heat in the package toward the external terminals of the package. In the example illustrated, the package is essentially constituted by the connecting support 15 and does not include a heat sink. However, it may be advantageous to use a flow of air, preferably ventilated, on the support and/or the plate in order to ensure proper cooling of the integrated circuit. On the other hand, it is clear that the invention applies to other types of packages than those described above. Depending on the type used, the package may include elements other than the support 15, such as a cover, for example. As is apparent from the preceding description, the additional elements of the package can of course contribute to the evacuation of the heat. Depending on the evacuation means used, the package can absorb a more or less substantial part of the heat issuing from the plate, the remaining part of which is absorbed by the wiring board 12. The smaller the number of external terminals 17 and/or the larger the quantity of heat to be evacuated to the board, the more massive the external terminals 17 will be. They can therefore be different from the balls and the pins illustrated.

It has been seen that the means for facilitating the evacuation of the heat in the package can be such that this material is at least partially heat conductive. In another auxiliary or additional form, in the case in which external terminals are respectively linked, inside the package, to conductive via holes, the means can be formed of respective extensions of the via holes toward the plate. In this case, which has been illustrated in FIG. 1, the extension of at least one via hole can comprise an islet 24 which extends from a surface S1 of the package opposite the plate and the islet can be placed in contact with the plate. The means for facilitating the evacuation of the heat in the package can also have a sufficient thickness of the plate to obtain a substantially uniform diffusion of the heat to the package.

In the package illustrated in FIG. 1, the plate is separated from the package by an electrically insulating layer 23. However, the figure makes it clear that it can also be connected directly to islets. In the package represented in FIG. 2, the plate is separated from the integrated circuit by an electrically insulating layer which can include a part 15a of the material constituting the package.

While the preferred forms and embodiments of the invention have been illustrated and described, it will be apparent to those of ordinary skill in the art that various changes and modifications may be made without deviating from the inventive concepts and spirit of the invention as set forth above, and it is intended by the appended claims to define all such concepts which come within the full scope and true spirit of the invention.

I claim:

1. A package (10) comprising an integrated circuit (11) adapted to be mounted to a wiring board (12), external terminals (17) connecting the package to the wiring board (12), the package including a connection support (15) connecting the external terminals to the integrated circuit, a heat conductive plate (13) connected to one surface of the integrated circuit for transmitting heat dissipated by the integrated circuit into the package, the plate extending beyond said surface of the integrated circuit over at least a number of said external terminals, the extended portion of the plate being thermally connected with the connection support over said number of external terminals to transfer a substantial part of heat from the integrated circuit through the plate and into the connection support (15) through, and means (15a, 19, 24) for facilitating the evacuation of the heat from the connection support, at least a portion of the heat transferred into the connection support being evacuated through the external terminals of the package.

2. The package according to claim 1, characterized in that the connection support includes an electrically insulating material (15a) and the means for facilitating evacuation is at least a partially heat conductive property for the electrically insulating material.

3. The package according to claim 1, characterized in that the external terminals are respectively linked, inside the connection support, to conductive via holes (19) and the means for facilitating evacuation comprises respective extensions of the via holes toward the plate.

4. The package according to claim 3, characterized in that the means for facilitating evacuation further comprises islet means (24) connected to the extension of at least one of said via holes and located between a surface (S1) of the connection support and the extended portion of the plate.

5. The package according to claim 4, characterized in that the islet is in contact with the plate.

6. The package according to claim 1, characterized in that the plate is thermally connected with the connection support through an electrically insulating layer (23).

7. The package according to claim 1, characterized in that the plate is separated from the integrated circuit by an electrically insulating layer constituting part of the material of the connection support.

8. The package according to claim 1, characterized in that the plate has a thickness which provides a substantially uniform diffusion of the heat transferred from the integrated circuit to the connection support.

9. A package (10) and wiring board assembly (12) said package comprising an integrated circuit (11), external terminals (17) for connecting the package to the wiring board (12), a connection support (15) for connecting the external terminals to the integrated circuit, a plate (13) connected to one surface of said integrated circuit for transmitting heat dissipated by the integrated circuit, the plate extending over at least a number of said external terminals beyond said surface of the integrated circuit and the extended portion of the plate being thermally connected with the connection support to transfer a substantial part of heat from the integrated circuit into the connection support through the plate, and means (15a, 19, 24) for facilitating the evacuation of the heat from the connection support through the external terminals of the package and into the wiring board.

10. The wiring board according to claim 9, characterized in that the connection support includes an electrically insulating material (15a) and the means for facilitating evacuation is a at least partially heat conductive property for the electrically insulating material.

11. The wiring board according to claim 9, characterized in that the external terminals are respectively linked, inside the connection support, to conductive via holes (19) and the means for facilitating evacuation comprises respective extensions of the via holes toward the plate.

12. The wiring board according to claim 11, characterized in that the means for facilitating evacuation further comprises islet means (24) connected to the extension of at least one of said via holes and located between a surface (S1) of the connection support and the extended portion of the plate.

13. The wiring board assembly according to claim 12, characterized in that the islet is in contact with the plate.

14. The wiring board according to claim 9, characterized in that the plate is thermally connected with the connection support through an electrically insulating layer (23).

15. The wiring board according to claim 9, characterized in that the plate is separated from the integrated surface by an electrically insulating layer constituting part of the material of the connection support.

16. The wiring board according to claim 9, characterized in that the plate has a thickness which provides a substantially uniform diffusion of the heat transferred from the integrated circuit to the connection support.

17. Process for cooling including an integrated circuit (11) mounted in a package support having a connection support (15) and a heat conductive plate (13) mounted over one surface of the integrated circuit and extending beyond said surface, said connection support having external terminals (17) for connection to a wiring board (12) and means (19) for connecting the external terminals to the integrated circuit, the process comprising extending the plate beyond said surface of the integrated circuit over at least a number of said external terminals to form a substantial thermal connection between the extended portion of the plate and the connection support to transfer a substantial part of heat from the integrated circuit into the connection support through the plate, and evacuating the heat transferred into the connection support, at least a portion of the heat transferred into the connection support being evacuated through the external terminals of the package.

* * * * *